(12) United States Patent
Takizawa et al.

(10) Patent No.: US 10,586,601 B2
(45) Date of Patent: Mar. 10, 2020

(54) SEMICONDUCTOR MEMORY DEVICE AND READ CONTROL METHOD THEREOF (71) Applicant: TOSHIBA MEMORY CORPORATION, Tokyo (JP)

(72) Inventors: Kazutaka Takizawa, Yokohama Kanagawa (JP); Masaaki Niijima, Machida Toyko (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 15 days.

(21) Appl. No.: 15/909,409

(22) Filed: Mar. 1, 2018

(65) Prior Publication Data
US 2018/0277227 A1 Sep. 27, 2018

(30) Foreign Application Priority Data
Mar. 24, 2017 (JP) .................. 2017-058897

(51) Int. Cl.
G06F 12/00 (2006.01)
G11C 16/26 (2006.01)
G11C 16/04 (2006.01)
G06F 3/06 (2006.01)
G11C 16/10 (2006.01)

(52) U.S. Cl.
CPC .......... *G11C 16/26* (2013.01); *G06F 3/0604* (2013.01); *G06F 3/0659* (2013.01); *G06F 3/0679* (2013.01); *G11C 16/0483* (2013.01); *G11C 16/10* (2013.01)

(58) Field of Classification Search
CPC ............ G06F 11/56–5692; G11C 11/56–5692
See application file for complete search history.

(56) References Cited

U.S. PATENT DOCUMENTS

| | | | |
|---|---|---|---|
| 8,009,474 B2 | 8/2011 | Nishihara et al. | |
| 8,261,158 B2 | 9/2012 | Thatcher et al. | |
| 8,305,809 B2 | 11/2012 | Shen et al. | |
| 9,251,892 B1* | 2/2016 | Asami ................. | G11C 11/5642 |
| 9,390,800 B2 | 7/2016 | Shiino et al. | |
| 2015/0332772 A1* | 11/2015 | Kim ....................... | G11C 16/32 365/185.22 |
| 2016/0266970 A1 | 9/2016 | Amaki et al. | |
| 2017/0117032 A1 | 4/2017 | Takizawa et al. | |

* cited by examiner

Primary Examiner — Daniel D Tsui
(74) Attorney, Agent, or Firm — Kim & Stewart LLP (57) ABSTRACT

A semiconductor memory device includes a nonvolatile memory and a controller. The nonvolatile memory has a plurality of memory cells that are connected to word lines to which a read voltage is applied at the time of reading data stored in the memory cells. The controller is configured to determine a read voltage for a target memory cell by selecting a tracking parameter based on a word line connected to the target memory cell and an elapsed time from a previous access to a group of memory cells including the target memory cell, and executing a tracking process on the memory cells also connected to the word line connected to the target memory cell using the selected tracking parameter.

17 Claims, 9 Drawing Sheets

FIG. 11 ated Mar. 24, 2017, the entire contents of which are incorporated herein by reference.

SEMICONDUCTOR MEMORY DEVICE AND READ CONTROL METHOD THEREOF

CROSS-REFERENCE TO RELATED APPLICATION

This application is based upon and claims the benefit of priority from Japanese Patent Application No. 2017-058897, filed Mar. 24, 2017, the entire contents of which are incorporated herein by reference.

FIELD

Embodiments described herein relate generally to a semiconductor memory device having a nonvolatile memory and a read control method thereof.

BACKGROUND

NAND-type flash memory is an example of a nonvolatile memory. In the NAND-type flash memory, as a program voltage or an erase voltage is repeatedly applied to memory cells, a tunnel oxide film of the memory cell may deteriorate, and an error may occur in programming, reading, or erasing for the memory cell.

DETAILED DESCRIPTION

Embodiments provide a semiconductor memory device and a read control method thereof, which reads data from a nonvolatile memory with good accuracy by appropriately determining a read voltage.

In general, according to one embodiment, a semiconductor memory device includes a nonvolatile memory and a controller. The nonvolatile memory has a plurality of memory cells that are connected to word lines, to which a read voltage is applied at the time of reading data stored in the memory cells. The controller is configured to determine a read voltage for a target memory cell by selecting a tracking parameter based on a word line connected to the target memory cell and an elapsed time from a previous access to a group of memory cells including the target memory cell, and executing a tracking process on the memory cells also connected to the word line connected to the target memory cell using the selected tracking parameter (one example of which is a voltage range).

Each embodiment will be described below with reference to the drawings. In the description that follows, the same reference numerals are attached to substantially or essentially the same functions and elements and a description thereof is provided if necessary.

First Embodiment

As an example of a nonvolatile memory of a first embodiment, a NAND-type flash memory will be exemplified. However, another type of memory may be used as long as a read voltage is applied to a memory cell when reading data stored in the memory cell. In addition, the nonvolatile memory may be, for example, a NOR-type flash memory, an MRAM (Magnetoresistive Random Access Memory), a PRAM (Phase change Random Access Memory), an ReRAM (Resistive Random Access Memory), or an FeRAM (Ferroelectric Random Access Memory).

Figure 1:
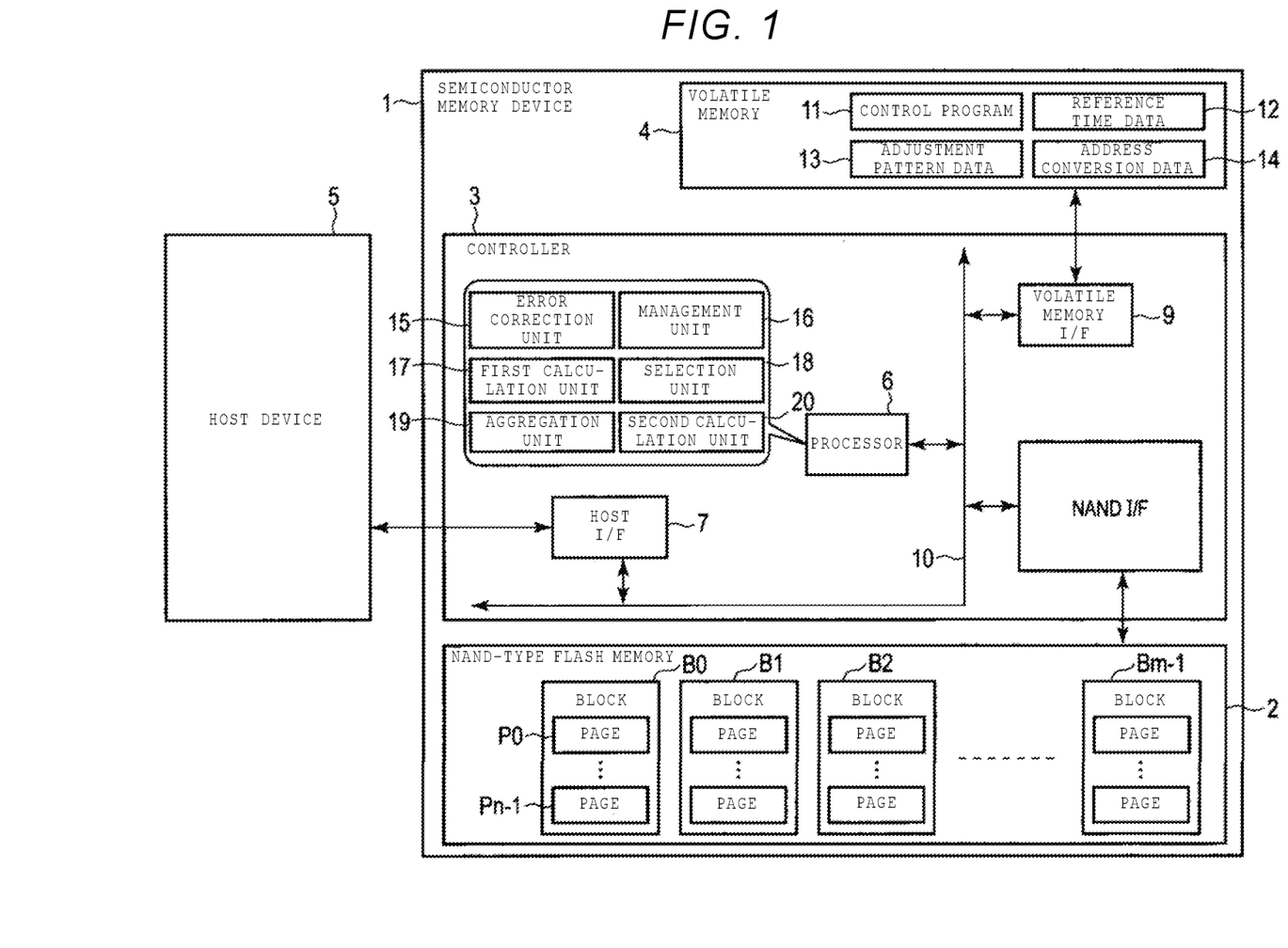
FIG. 1 is a block diagram illustrating an example of a semiconductor memory device according to a first embodiment.

FIG. 1 is a block diagram illustrating an example of a semiconductor memory device 1 according to this embodiment. FIG. 1 illustrates a case where the semiconductor memory device 1 is a solid state drive (SSD), for example. However, the semiconductor memory device 1 may be a device such as a memory card which is different from the SSD. In FIG. 1, only components related to determination and change of a read voltage according to this embodiment are illustrated, and other components are not illustrated.

The semiconductor memory device 1 includes a NAND-type flash memory 2, a controller 3, and a volatile memory 4. Further, the semiconductor memory device 1 is connected to a host device 5 that accesses the semiconductor memory device 1.

The host device 5 may be a storage server that stores a large amount of data in the semiconductor memory device 1, or may be a personal computer. The semiconductor memory device 1 may be used as a main storage of the host device 5. The semiconductor memory device 1 may be integrated within the host device 5, or may be connected to the host device 5 via a network.

The host device 5 transmits a write command (also referred to as a program command), a logical address, and write data to the semiconductor memory device 1 when writing data to the semiconductor memory device 1. The host device 5 transmits a read command and a logical address to the semiconductor memory device 1 when reading data from the semiconductor memory device 1.

The NAND-type flash memory 2 includes a memory cell array, and the memory cell array includes a plurality of memory cells arranged in a matrix configuration. The NAND-type flash memory 2 may be a NAND-type flash memory having a two-dimensional structure, or a NAND-type flash memory having a three-dimensional structure. The memory cell array includes a plurality of physical blocks B0 to Bm-1. Each of the physical blocks B0 to Bm-1 includes a plurality of pages (herein, pages P0 to Pn-1). The physical blocks B0 to Bm-1 function as minimum erasure units. The physical block may be referred to as an "erase block, a "physical erase block", or simply a "block". Each of the pages P0 to Pn-1 includes a plurality of memory cells connected to the same word line. The pages P0 to Pn-1 are units of a data writing operation and a data reading operation. In this embodiment, the page is identified using a word line number, but the page may be identified using identifier other than the word line number. A more detailed configuration of the memory cell array will be described with reference to FIG. 2 later.

The controller 3 includes a processor 6, a host interface 7, a NAND interface 8, and a volatile memory interface 9. The processor 6, the host interface 7, the NAND interface 8, and the volatile memory interface 9 is connected to each other via a bus 10.

The processor 6 receives various commands (for example, a write command and a read command) from the host device 5 through the host interface 7. In addition, the processor 6 transmits data (for example, read data and error information) to the host device 5 through the host interface 7. An example of the processor 6 includes CPU (Central Processing Unit) or MPU (Microprocessor Unit).

When receiving a write command from the host device 5 through the host interface 7 and the bus 10, the processor 6 writes data to the NAND-type flash memory 2 through the bus 10 and the NAND interface 8 according to the write command.

When receiving a read command from the host device 5 through the host interface 7 and the bus 10, the processor 6 reads data from the NAND-type flash memory 2 through the NAND interface 8 and the bus 10 according to the read command and transmits the read data to the host device 5 through the bus 10 and the host interface 7.

In such a reading operation, the processor 6 applies a read voltage to the memory cell of the NAND-type flash memory 2, and determines the data stored in the memory cell 44. Even when executing a patrol process or the like in the background, the processor 6 applies a read voltage to the memory cell of the NAND-type flash memory 2, and determines the data stored in the memory cell 44.

The processor 6 can write data to the volatile memory 4 through the volatile memory interface 9, and can read data from the volatile memory 4.

In the following description, the description will not be given with respect to the host interface 7, the NAND interface 8, the volatile memory interface 9, and the bus 10, for simplicity of explanation.

In response to a power-on of the semiconductor memory device 1, the processor 6 reads a control program (e.g., firmware) 11, reference time data 12, adjustment pattern data (which is data indicating the range of a voltage for executing a tracking process) 13, and address conversion data 14, which have been stored in the NAND-type flash memory 2, to store in the volatile memory 4. The processor 6 performs various processes by executing the control program 11.

The processor 6 executes the control program 11 to function as, for example, an error correction unit 15, a management unit 16, a first calculation unit 17, a selection unit 18, an aggregation unit 19, and a second calculation unit 20. At least one of the error correction unit 15, the management unit 16, the first calculation unit 17, the selection unit 18, the aggregation unit 19, and the second calculation unit 20 realized by the processor 6 may be realized in hardware, or may be provided in the controller 3 having a configuration different from that of the processor 6.

The error correction unit 15 executes ECC (Error Checking and Correction). The error correction unit 15 detects and corrects an error of data read from the NAND-type flash memory 2, using an error correction code such as an LDPC (Low Density Parity Check) code or a BCH (Bose Chaudhuri Hocquenghem) code. In this embodiment, the processor 6 transmits a tracking command, which instructs the start of the tracking process, to the first calculation unit 17 when determining that the error correction has failed, e.g., when the number of error bits of the read data exceeds the error correcting capability of the error correction unit 15.

The management unit 16 manages a write reference time at which each block of the NAND-type flash memory 2 was last written, a read count of each page, and a write count of each page, using the reference time data 12 stored in the volatile memory 4. A specific example of the reference time data 12 will be described below with reference to FIG. 7.

In this embodiment, the management unit 16 manages the write reference time at which the block was last written. Instead of this, however, the management unit 16 may manage a reference time at which the page was last written, may manage a read reference time at which the block or the page was last read. In this embodiment, the first calculation unit 17 calculates an elapsed time using one or more of these reference times.

When the tracking command is received from the error correction unit 15, the first calculation unit 17 acquires the write reference time for the block including a tracking target page using the reference time data 12 and calculates an elapsed time from the acquired write reference time to a time to read the tracking target page.

In this embodiment, the first calculation unit 17 calculates the elapsed time from the write reference time to the time to read the tracking target page. Instead of this, the first calculation unit 17 may calculate an elapsed time from a reference time at which the tracking target page was last written to the time to read the tracking target page. In addition, the first calculation unit 17 may calculate an elapsed time from a read reference time at which the block including the tracking target page was last read to the time to read the tracking target page. Further, the first calculation unit 17 may calculate an elapsed time from a reference time at which the tracking target page was last read to the time to read the tracking target page.

When the tracking process is executed to determine a read voltage to be used for the tracking target page of the NAND-type flash memory 2, the selection unit 18 refers to the adjustment pattern data 13 in the volatile memory 4, and selects an adjustment pattern associated with the word line number corresponding to the tracking target page, the elapsed time corresponding to the tracking target page calculated by the first calculation unit 17, the read count corresponding to the tracking target page, and the write count corresponding to the tracking target page.

In this embodiment, the adjustment pattern is selected using the word line number. Instead of the word line number, the adjustment pattern may be selected using, for example, block identifier or chip identifier of the NAND-type flash memory 2.

In this embodiment, the tracking process is executed by the aggregation unit 19 and the second calculation unit 20. The aggregation unit 19 and the second calculation unit 20 execute the tracking process on the tracking target page according to the adjustment pattern selected by the selection unit 18, and determine a new read voltage.

The aggregation unit 19 performs statistical processing on a distribution state of a threshold voltage of the memory cell in the NAND-type flash memory 2 according to the adjustment pattern selected from the adjustment pattern data 13, and transmits the statistical result (in particular, statistical value) to the second calculation unit 20.

In this embodiment, the statistical processing includes, for example, a process of determining a read voltage as the most frequent value in a distribution of threshold voltages versus number of cells, in the case where the cells have a normal distribution of threshold voltages. In this embodiment, the statistical result includes summary statistics for the distribution of the number of memory cells with respect to the threshold voltages, and includes information such as an average value, an intermediate value, a standard deviation, a variance, a kurtosis, a skewness, and the most frequent value, as more specific example. In addition, the statistical result may include various indices indicated by the obtained statistical distribution amount.

The second calculation unit 20 calculates the read voltage for the memory cell and determines the read voltage, using the statistical result received from the aggregation unit 19.

A more detailed configuration of the tracking process executed by the aggregation unit 19 and the second calculation unit 20 will be described below with reference to FIGS. 3 to 5.

As described above, the volatile memory 4 stores the control program 11, the reference time data 12, the adjustment pattern data 13, and the address conversion data 14.

The adjustment pattern data 13 may be, for example, data in a table that associates, a plurality of word line numbers, a plurality of elapsed times, a plurality of read counts (which may be represented as a range of the read count), a plurality of write counts (which may be represented as a range of the write count), and a plurality of adjustment patterns, with each other. However, the adjustment pattern data 13 may be data in a list that associates the plurality of word line numbers, the plurality of elapsed times, the plurality of read counts, the plurality of write counts, and the plurality of adjustment patterns, with each other. Instead of the adjustment pattern data 13, the adjustment pattern may be calculated by a formula that takes one or more of the word line number, the elapsed time, the read count, and the write count as an input value. The adjustment pattern data 13 may be stored in a memory (not illustrated) in the controller 3.

The adjustment pattern includes, for example, a reference voltage serving as a reference of the range of the read voltage in the tracking process, a plurality of read voltages (which may be expressed by a gap value) determined from the reference voltage, and the number of observation points (number of steps) of the read voltage used in the tracking process.

The address conversion data 14 is used, for example, to convert a logical address received from the host device 5 into a physical address of the NAND-type flash memory 2.

The volatile memory 4 may include a buffer that temporarily stores the write data received from the host device 5 and the read data read from the NAND-type flash memory 2.

An example of the volatile memory 4 may include DRAM (Dynamic Random Access Memory) or the like. The volatile memory 4 may partially or entirely be integrated in the controller 3. When the access speed from the processor 6 is sufficiently high, a nonvolatile memory may be used instead of the volatile memory 4. Further, the volatile memory 4 and the nonvolatile memory may be used in combination with each other.

Figure 2:
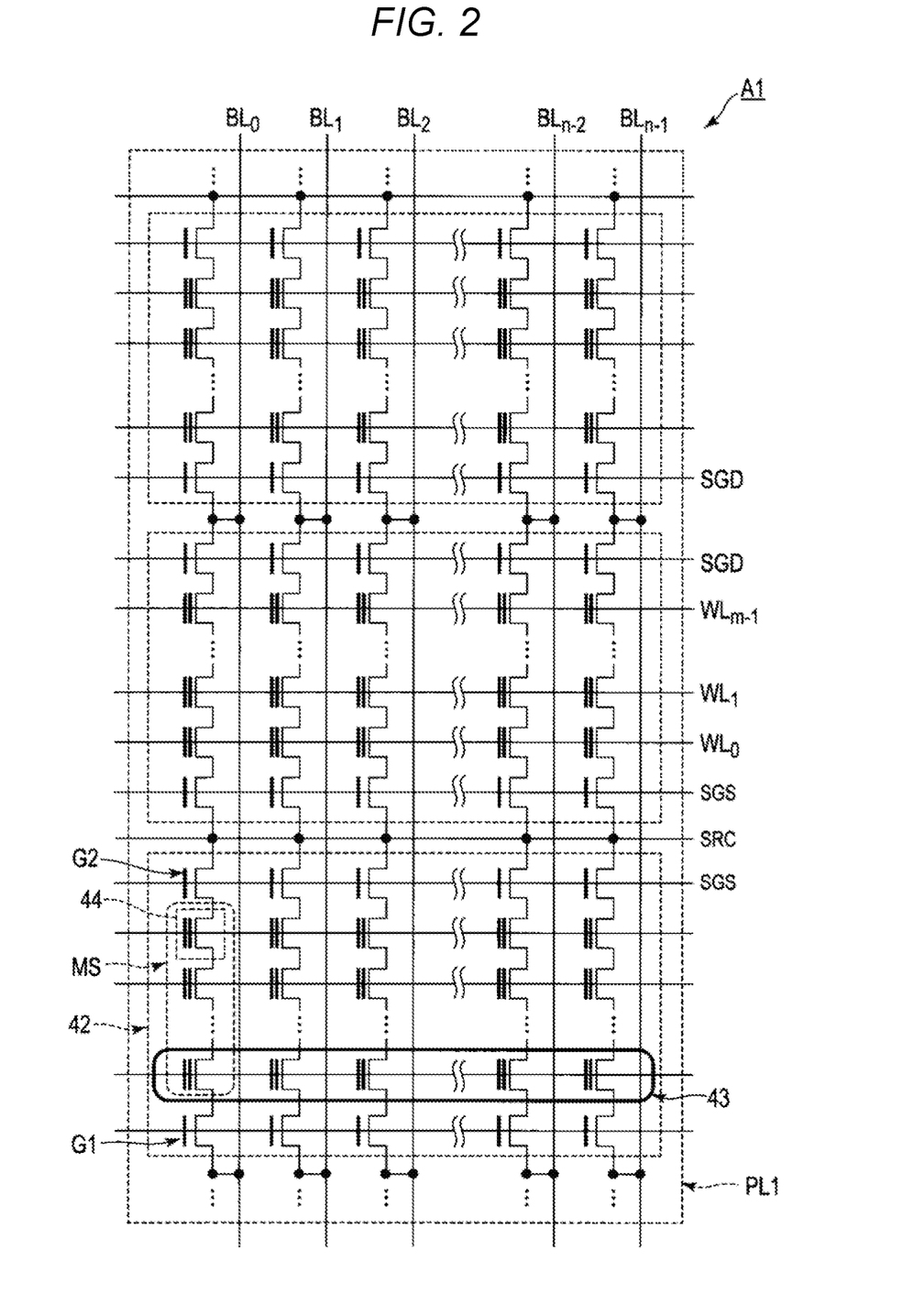
FIG. 2 is a circuit diagram illustrating an example of a configuration of a memory cell array.

FIG. 2 is a circuit diagram illustrating an example of a configuration of the memory cell array.

A memory cell array A1 is a NAND cell-type memory cell array, which includes a plurality of NAND cells in which the plurality of memory cells 44 are arranged in a matrix configuration. One NAND cell includes a memory string MS made up of the memory cells 44 connected in series and selection gate transistors G1 and G2 connected to both ends thereof. The selection gate transistor G1 is connected to one of bit lines $BL_0$ to $BL_{n-1}$. The selection gate transistor G2 is connected to a source line SRC. A control gate of the memory cell 44 arranged in the same row is connected in common to one of word lines $WL_0$ to $WL_{m-1}$. A gate terminal of the first selection gate transistor G1 is connected in common to a selection line SGD. A gate terminal of the second selection gate transistor G2 is connected in common to a selection line SGS.

The memory cell array A1 includes one or more planes PL1. The plane PL1 includes a plurality of blocks 42. Each of the blocks 42 includes a plurality of NAND cells and is a unit of data erasure.

The plurality of memory cells 44 connected to one word line constitute one memory cell group 43 and represents a physical sector. When each memory cell 44 stores one bit, one memory cell group 43 corresponds to one page. When each memory cell 44 stores two or more bits, one memory cell group 43 corresponds to a plurality of pages. The data is written and read out for each page in the NAND-type flash memory. At the time of a read operation, a program verify operation, and a program operation, one word line is selected and one page is selected according to the physical address received from the controller 3. The switching of the page is performed based on the physical address.

Figure 3:
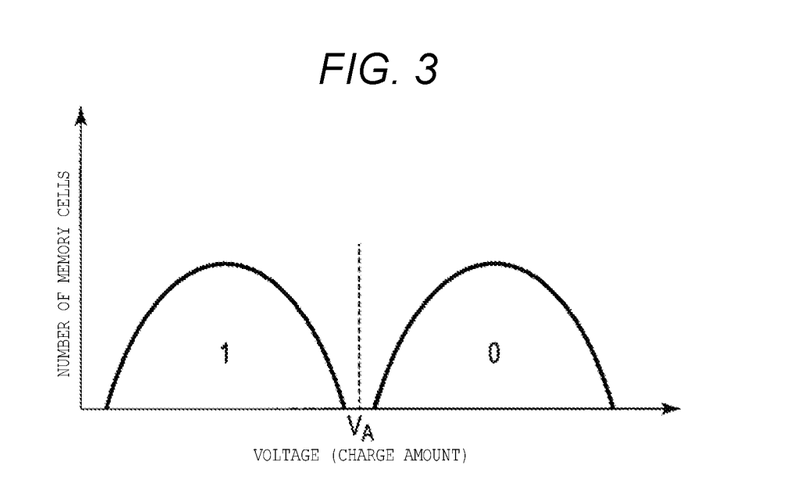
FIG. 3 is a graph illustrating a first example of a threshold voltage distribution.
Figure 4:
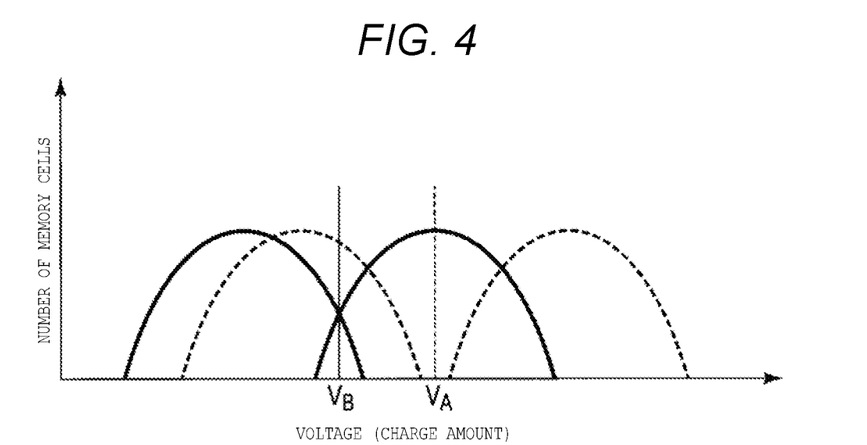
FIG. 4 is a graph illustrating a second example of a threshold voltage distribution.

FIG. 3 is a graph illustrating a first example of a threshold voltage distribution. FIG. 4 is a graph illustrating a second example of a threshold voltage distribution. The distribution illustrated in FIG. 4 indicates a state in which a charge amount of the floating gate of the memory cell 44 varies from the distribution illustrated in FIG. 3.

In each memory cell 44, when a voltage equal to or higher than a voltage level corresponding to the charge amount of the floating gate is applied to the control gate, a current flows through the memory cell 44, and when a voltage less than the voltage level is applied to the control gate, no current flows through the memory cell 44. This voltage corresponding to the charge amount of the floating gate is called a threshold voltage. Each memory cell 44 has a threshold voltage corresponding to any one of the plurality of threshold voltage distributions (also referred to herein as threshold distribution). The read voltage is applied to the memory cell 44 at the time of reading, and the data stored in the memory cell 44 is determined depending on whether the read voltage is lower or higher than the threshold voltage. In this embodiment, the description will be given with respect to an example of 1-bit/cell in which each memory cell 44 stores one bit of data, for simplicity of explanation. In FIGS. 3 and 4, a vertical axis indicates the number of memory cells, and a horizontal axis indicates the threshold voltage (corresponding to the charge amount of the floating gate).

As illustrated in FIG. 3, the left threshold distribution of two threshold distributions corresponds to data "1", and the right threshold distribution corresponds to data "0". Each memory cell 44 as illustrated has a threshold voltage corresponding to one of the two threshold distributions. At the time of reading from the NAND-type flash memory 2, a read voltage of a default value (hereinafter, referred to as a "default read voltage") $V_A$ for delimiting the two threshold distributions is applied to each memory cell 44, and thus it is possible to determine whether data stored in each memory cell 44 is "1" or "0".

On the other hand, error factors such as a data retention error, a read disturbance error, and a program disturbance error exist in the NAND-type flash memory 2. Due to these error factors, the charge amount of the floating gate of the memory cell 44 may change, and the threshold distribution may change. In FIG. 4, the threshold distribution illustrated in FIG. 3 is indicated by a dotted line. In FIG. 4, a solid line indicates a state in which the threshold distribution has changed to a low voltage side as compared to the case illustrated in FIG. 3. Therefore, a read voltage (VB), at which the two threshold distributions illustrated in FIG. 4 are to be delimited, is shifted from the default read voltage VA in FIG. 3 to the low voltage side. For this reason, when reading is continued using the initially determined default read voltage VA, the read error may increase.

The read error can be corrected when the read data is subjected to error correction by the error correction unit 15. However, when the number of error bits in the read data exceeds error correction processing capability of the error correction unit 15, the error correction fails. The tracking process determines an appropriate read voltage conforming to the change in the threshold distribution to prevent failure of such error correction.

The tracking process will be described herein. As an example of the tracking process, there is a method of sweeping the read voltage to the memory cell 44 with a minimum voltage width realizable in the semiconductor memory device as a unit and accurately determining the threshold distribution of the plurality of memory cells 44. However, in order to accurately determine the threshold distribution using this method, the number of times of application of the read voltage (i.e., the read count) to each memory cell 44 becomes enormous. In addition, it takes a long time to calculate the read voltage, and a stress due to the multiple read operation applied to each memory cell 44 becomes high. When the stress applied to each memory cell 44 in the NAND-type flash memory becomes high, the data may be erroneously stored in the memory cell 44.

Figure 5:
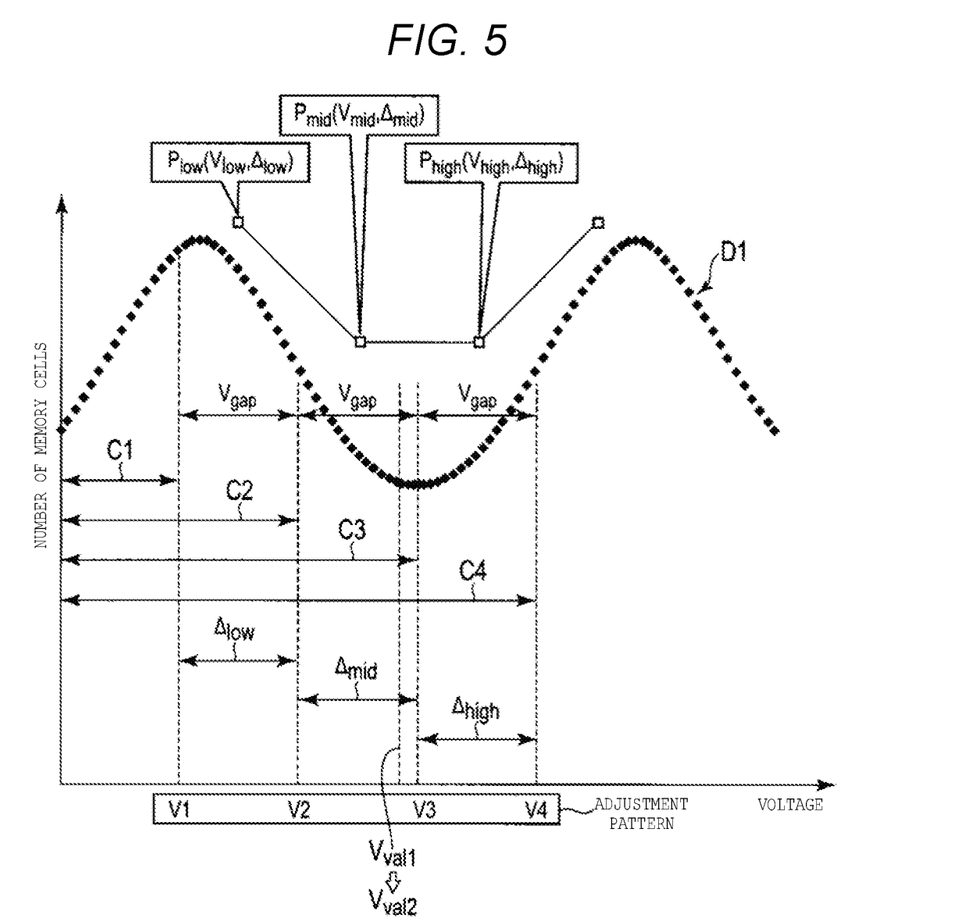
FIG. 5 is a graph illustrating an example of a threshold voltage distribution obtained by changing a read voltage applied to a memory cell belonging to a memory cell group with a minimum voltage width that can be realized by a semiconductor memory device.

FIG. 5 is a graph illustrating an example of a threshold distribution D1 obtained by changing a read voltage applied to the memory cell 44 belonging to one memory cell group with the minimum voltage width that can be realized by a typical semiconductor memory device, as a unit. In FIG. 5, a horizontal axis indicates a read voltage for the memory cell 44 or a threshold voltage of the memory cell 44. A vertical axis indicates the number of memory cells. In the typical semiconductor memory device, the read voltage is determined after the overall threshold distribution D1 is clarified. For example, a voltage for which the number of memory cells is minimum in the threshold distribution D1 is determined as a read voltage. However, since this method requires a large number of times of reading as described above, it takes a long time to calculate the read voltage, and a stress applied to each memory cell 44 may become high. Therefore, in the tracking process, it is preferable to reduce the read count and determine the read voltage for the memory cell 44 and not to determine the overall threshold distribution D1. In general, there is a technique of setting only some voltage range as a search target in the threshold distribution and determining the read voltage. However, when an optimum read voltage is out of the voltage range as the search target, it is necessary to re-search another voltage range, so that the read count increases. Therefore, according to this embodiment, the voltage range of the search target in the threshold distribution is corrected as appropriate.

In this embodiment, the voltage range is selected in association with the word line connected to the plurality of memory cells 44, the elapsed time from the previous read or write with respect to the plurality of memory cells 44, the read count with respect to the plurality of memory cells 44, and the write count with respect to the plurality of memory cells 44, for example, and the tracking process is executed within the selected voltage range. In this embodiment, since the tracking process is executed within the selected voltage range, it is possible to shorten the time until the read voltage is determined, and to determine an appropriate read voltage from the selected voltage range even when the threshold voltage is different due to the difference of word lines, the elapsed time, the read count, and the write count.

In the following description, first, an example of the tracking process executed according to the adjustment pattern selected from the adjustment pattern data 13 will be described, and then data and processing relating to the selection of the adjustment pattern will be described with reference to FIGS. 6 to 9.

In the tracking process, the aggregation unit 19 applies read voltages V1 to V4 to one memory cell group of the NAND-type flash memory 2 according to the adjustment pattern selected from the adjustment pattern data 13. The read voltages V1 to V4 satisfy the relation of V1<V2<V3<V4. Widths $V_{gap}$ between the respective read voltages (between the read voltages V1 and V2, between the read voltages V2 and V3, and between the read voltages V3 and V4) may be equal or irregular.

The aggregation unit 19 aggregates the total number C1, C2, C3, or C4 of memory cells 44 through which a current flows for each of the read voltages V1 to V4. The total number C1 is the sum of the number of memory cells corresponding to the read voltage V1 or less in the threshold distribution D1. The total number C2 is the sum of the number of memory cells corresponding to the read voltage V2 or less in the threshold distribution D1. The total number C3 is the sum of the number of memory cells corresponding to the read voltage V3 or less in the threshold distribution D1. The total number C4 is the sum of the number of memory cells corresponding to the read voltage V4 or less in the threshold distribution D1.

Then, the aggregation unit 19 respectively calculates the number of cells $\Delta_{low}$, $\Delta_{mid}$, and $\Delta_{high}$ of the memory cell 44 having the threshold voltages between the respective read voltages (between the read voltages V1 and V2, between the read voltages V2 and V3, and between the read voltages V3 and V4). The aggregation unit 19 sets the number=(total number C2−total number C1) as the number of cells $\Delta_{low}$, the number=(total number C3−total number C2) as the number of cells $\Delta_{mid}$, and the number=(total number C4−total number C3) as the number of cells $\Delta_{high}$. Here, the aggregation unit 19 adjusts the read voltages V1 to V4 and aggregates the total numbers C1 to C4 such that the number of cells $\Delta_{low}$, $\Delta_{mid}$, and $\Delta_{high}$ satisfies the relation of $\Delta_{mid} \leq \Delta_{low}$ and $\Delta_{mid} \leq \Delta_{high}$. In addition, the aggregation unit 19 determines intermediate voltages $V_{low}$, $V_{mid}$, and $V_{high}$ each corresponding to the number of cells $\Delta_{low}$, $\Delta_{mid}$, and $\Delta_{high}$. The intermediate voltage $V_{low}$ is an intermediate point between the read voltages V2 and V1, which is (V2+V1)/2. The intermediate voltage $V_{mid}$ is an intermediate point between the read voltages V3 and V2, which is (V3+V2)/2. The intermediate voltage $V_{high}$ is an intermediate point between the read voltages V4 and V3, which is (V4+V3)/2. In FIG. 5, the intermediate point between the read voltages V2 and V1 is plotted as a $P_{low}$ ($V_{low}$, $\Delta_{low}$), the intermediate point between the read voltages V3 and V2 is plotted as a $P_{mid}$ ($V_{mid}$, $\Delta_{mid}$), and the intermediate point between the read voltages V4 and V3 is plotted as a $P_{high}$ ($V_{high}$, $\Delta_{high}$). The aggregation unit 19 sends data relating to the width $V_{gap}$ and the intermediate points $P_{low}$, $P_{mid}$, and $P_{high}$ to the second calculation unit 20.

When receiving the data, the second calculation unit 20 calculates a read voltage $V_{val1}$ according to the following Equation (1).

[Equation 1]

$$v_{val1} = v_{mid} + \frac{v_{gap}}{2} \times \frac{\Delta_{low} - \Delta_{high}}{(\Delta_{low} - \Delta_{mid}) + (\Delta_{high} - \Delta_{mid})} \quad (1)$$

The read voltage $V_{val1}$ calculated by the second calculation unit 20 is, for example, any one value between the read voltage V1 and the read voltage V4. In an example in FIG. 5, the read voltage $V_{val1}$ is a value internally dividing the read voltages V2 and V3 at a ratio of $(\Delta_{low}-\Delta_{mid}):(\Delta_{high}-\Delta_{mid})$. Further the read voltage $V_{val1}$ can be evaluated as a value corresponding to a valley portion in the threshold distribution of the memory cell 44 at the time of reading from the NAND-type flash memory 2.

The second calculation unit 20 performs predetermined arithmetic processing such as rounding off on the read voltage $V_{val1}$ and calculates a read voltage $V_{val2}$ closest to the read voltage $V_{val1}$ among the read voltages usable in the semiconductor memory device 1. In this manner, the process of determining the read voltage $V_{val1}$ or the read voltage $V_{val2}$ is referred to as the tracking process. Thus, the semiconductor memory device 1 can reduce the read count with respect to the memory cell 44 by determining the read voltage $V_{val2}$ as the read voltage, as compared with the case of determining the overall threshold distribution D1 to determine the read voltage. In FIG. 5, the case of determining the read voltage used for reading of the memory cell group 43 is described as an example, but the tracking process may be executed when the read voltage is determined with respect to the memory chip, and may executed when the read voltage is determined with respect to the block.

Figure 6:
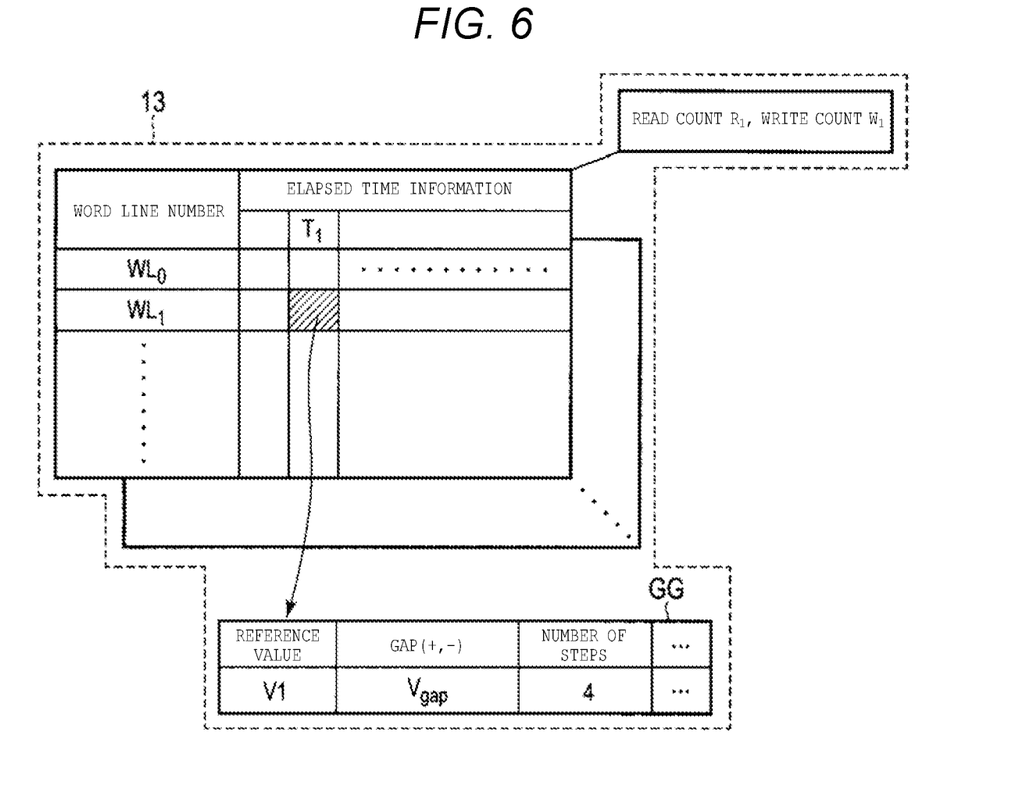
FIG. 6 is a data structure diagram illustrating an example of adjustment pattern data.

FIG. 6 is a data structure diagram illustrating an example of the adjustment pattern data 13.

In FIG. 6, an adjustment pattern is managed corresponding to each of a plurality of word line numbers, a plurality of pieces of elapsed time information, a plurality of read counts, and a plurality of write counts. Instead, the range of read counts or the range of write counts may be managed to reduce the data amount of the adjustment pattern data 13. In the example of FIG. 6, an adjustment pattern GG is associated with a word line number $WL_1$, elapsed time information $T_1$, a read count $R_1$, and a write count $W_1$. Therefore, the tracking process on a page corresponding to the read count $R_1$, the write count $W_1$, the elapsed time information $T_1$, and the word line number $WL_1$, is executed using the adjustment pattern GG.

The adjustment pattern GG includes, for example, a reference value V1 of the read voltage used in the tracking process, a difference $V_{gap}$ from the reference value V1 of the read voltage used in the tracking process, and the number of steps "4" corresponding to the number of observation points of the read voltage used in the tracking process.

For example, conditions such as the word line number, the elapsed time information, the read count, and the write count are statistically determined to have a range suitable for performing the tracking process, and thus the adjustment patterns, for example, the reference value, the gap, and the number of steps are determined.

Figure 7:
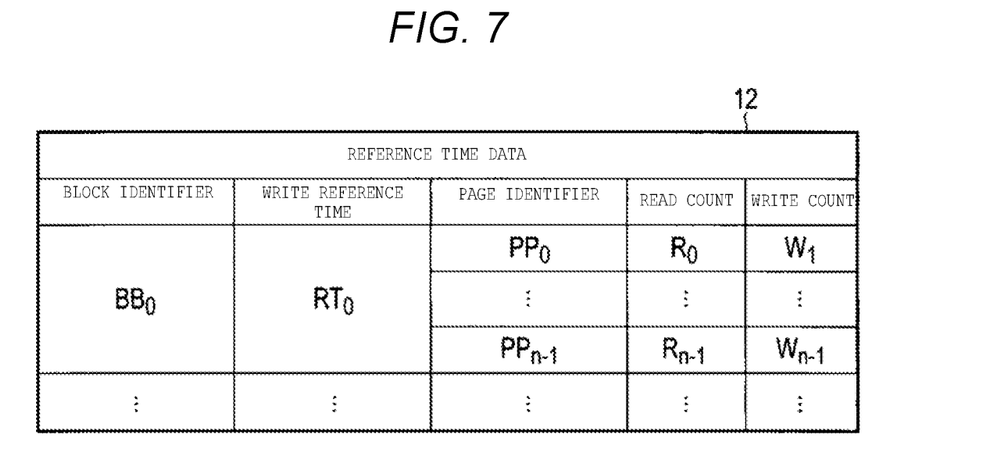
FIG. 7 is a data structure diagram illustrating an example of reference time data according to the first embodiment.

FIG. 7 is a data structure diagram illustrating an example of the reference time data 12 according to this embodiment.

In FIG. 7, information on the block B0 in FIG. 1 is exemplified for simplicity of explanation, but the same can be applied to information on other blocks B1 to Bm-1.

The reference time data 12 is associated with block identifier $BB_0$ with respect to the block B0, a write reference time $RT_0$ with respect to the block B0, page identifier $PP_0$ to $PP_{n-1}$ with respect to pages P0 to Pn-1 included in the block B0 respectively, and read counts $R_1$ to $R_{n-1}$ and write counts $W_1$ to $W_{n-1}$ with respect to the pages P0 to Pn-1 respectively.

As the block identifier $BB_0$ and the page identifier $PP_0$ to $PP_{n-1}$, a logical address or a physical address may be used.

The reference time data 12 may include the read reference time for each of the blocks B0 to Bn-1 together with the write reference time for each of the blocks B0 to Bn-1 or in place of the write reference time of the blocks B0 to Bn-1. In addition, the write reference time and the read reference time may be determined for each page. The read count and the write count may be determined for each block.

Figure 8:
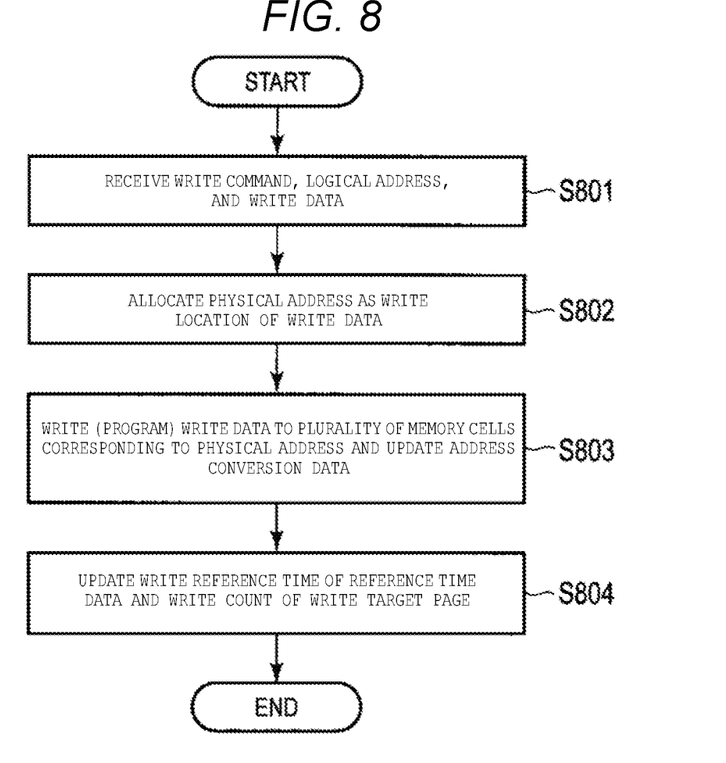
FIG. 8 is a flowchart illustrating an example of a write process according to the first embodiment.

FIG. 8 is a flowchart illustrating an example of the write process according to this embodiment.

In step S801, the processor 6 receives a write command, a logical address, and write data from the host device 5.

In step S802, the processor 6 allocates a physical address as a write location of the write data.

In step S803, the processor 6 writes (also referred to as programs) the write data to the plurality of memory cells 44 included in the NAND-type flash memory 2 and corresponding to the physical address allocated as the write location, and updates the address conversion data 14.

In step S804, the management unit 16 updates the write reference time corresponding to the block as the write location and the write count corresponding to the write target page, in the reference time data 12 stored in the volatile memory 4.

Figure 9:
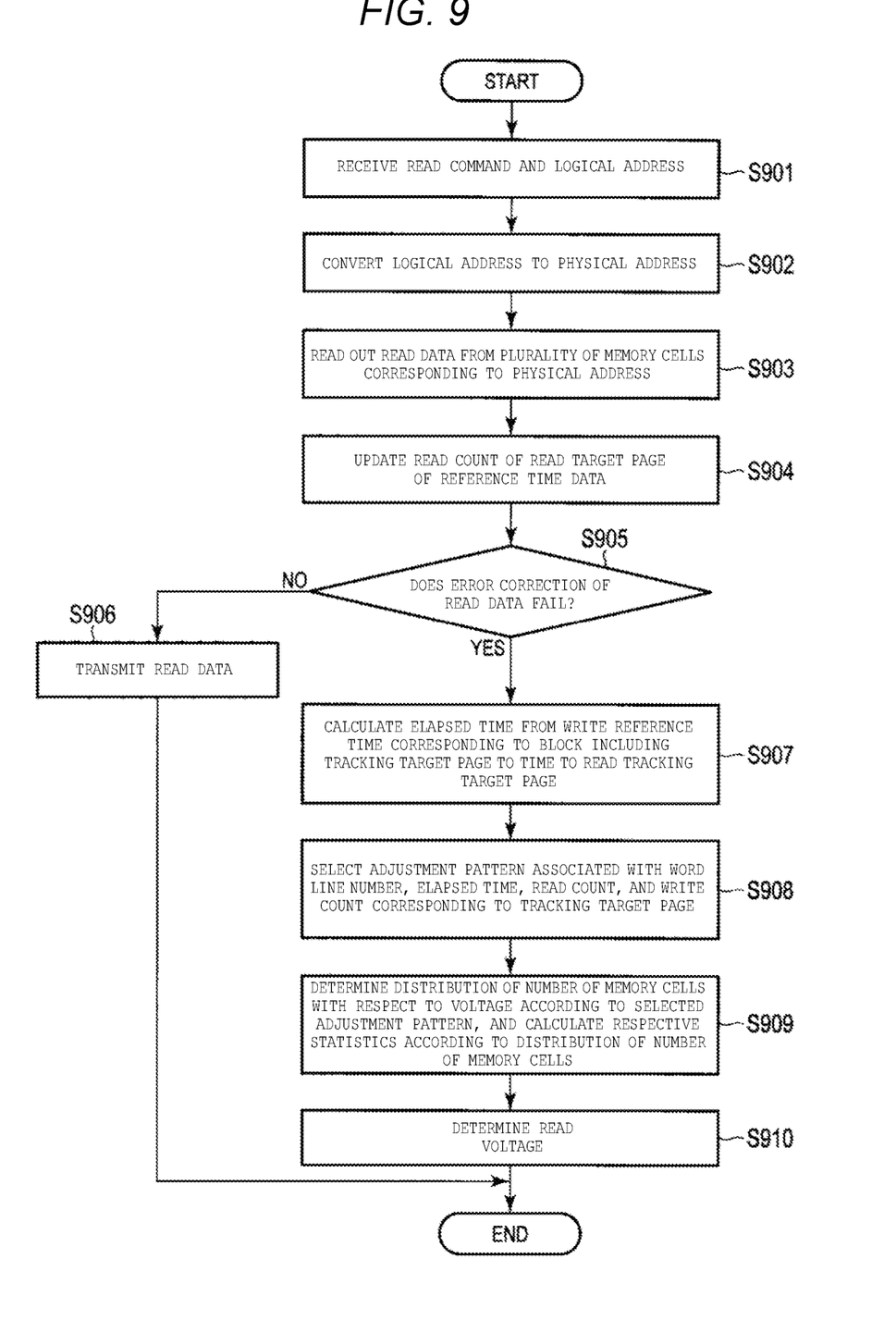
FIG. 9 is a flowchart illustrating an example of a read process according to the first embodiment.

FIG. 9 is a flowchart illustrating an example of the read process according to this embodiment.

In step S901, the processor 6 receives a read command and a logical address from the host device 5.

In step S902, the processor 6 converts the received logical address to a physical address according to the address conversion data 14 stored in the volatile memory 4.

In step S903, the processor 6 reads out read data from the plurality of memory cells included in the NAND-type flash memory 2 and corresponding to physical address obtained by the address conversion.

In step S904, the management unit 16 updates a read count corresponding to the read target page in the reference time data 12 stored in the volatile memory 4.

In step S905, the error correction unit 15 detects and corrects an error of the read data read from the NAND-type flash memory 2, and determines whether the error correction on the read data is successful.

When no error is detected or the error correction is successful, the processor 6 transmits the read data, in which no error is detected or the error correction is successful, to the host device 5 in step S906. Thereafter, the process is ended.

When the error correction fails, the process proceeds to step S907. In this embodiment, when the number of error bits detected in the read data is equal to or larger than the threshold value, the process proceeds to step 907 in order to perform the tracking process even when the error correction unit 15 determines that the error correction of the read data is successful.

In step S907, the first calculation unit 17 acquires the write reference time for the block including the tracking target page using the reference time data 12, and calculates an elapsed time from the acquired write reference time to a time to read the tracking target page.

In step S908, the selection unit 18 refers to the adjustment pattern data 13, and selects an adjustment pattern associated with the word line number corresponding to the tracking target page, the elapsed time corresponding to the tracking target page calculated by the first calculation unit 17, the read count corresponding to the tracking target page, and the write count corresponding to the tracking target page.

In step S909, the aggregation unit 19 determines the distribution of the number of memory cells with respect to the threshold voltage in the NAND-type flash memory 2 according to the adjustment pattern selected from the adjustment pattern data 13, and calculates various statistics according to the distribution as described above.

In step S910, the second calculation unit 20 calculates the read voltage for the memory cell 44 and determines the read voltage for the tracking target page, using the statistics obtained by the aggregation unit 19.

In step S910, when the read voltage is determined, the process returns to step S903, and the processor 6 retries the read to read data from the NAND-type flash memory 2 using the determined read voltage. When the error correction also fails in the retry of this read (YES in step S905), for example, the elapsed time calculated in the process of step S907 is changed, the process proceeds to step S908.

Further, when the read voltage is determined in step S910, the determined read voltage is stored. When a read operation occurs in the same memory cell 44, the read operation is performed using the stored read voltage.

For example, when the error correction of the read data fails or the number of error bits detected in the read data is equal to or larger than the threshold value, a typical tracking process is first executed, and the tracking process according to this embodiment may be executed when the number of error bits of the read data read from the NAND-type flash memory 2 does not decrease even if the typical tracking process is executed. The tracking process according to this embodiment may be periodically executed, for example, as one of the background processes of the semiconductor memory device 1.

According to this embodiment described above, even when the threshold voltage distribution changes, the voltage range associated with the word line, the elapsed time, the read count, and the write count corresponding to the memory cell to be read is selected, and the tracking process is executed in the voltage range. Thus, even when the threshold voltage varies among the word lines, or when the threshold voltage varies due to the elapsed time, the read count, and the write count, the tracking process can be executed in the appropriate voltage range, and the appropriate read voltage can be determined. Therefore, it is possible to reduce the number of read operations necessary for determining the appropriate read voltage and the processing time required for determining the read voltage.

According to this embodiment, it is possible to make the voltage range to be subjected to the tracking process appropriate and to shorten the search time of the read voltage.

Figure 10:
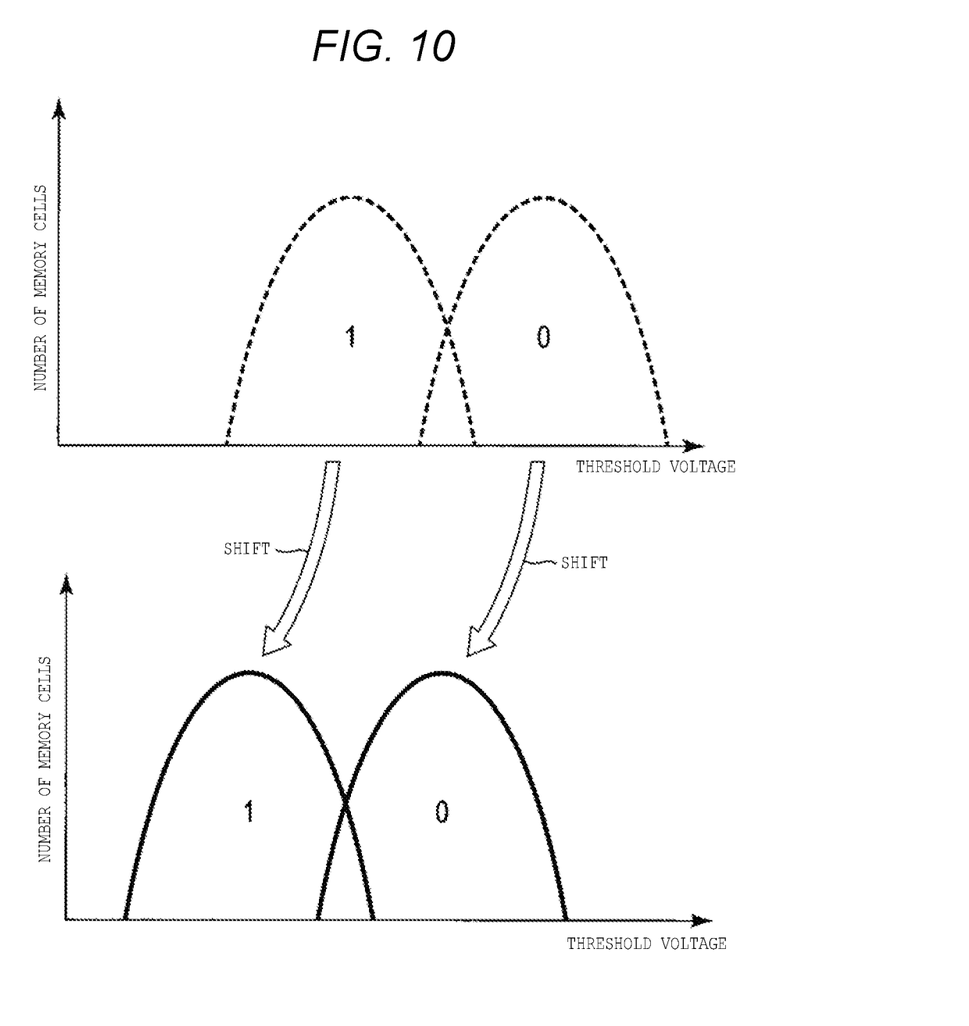
FIG. 10 is a graph illustrating an example of a state where a threshold voltage is shifted with the lapse of time.

For example, in the NAND-type flash memory having three-dimensional structure, the threshold voltage may be shifted with the lapse of time as illustrated in FIG. 10, and the threshold voltage may also be different between the word lines. The threshold voltage may be shifted with the lapse of a relatively short time, for example, several minutes.

As a comparative example of coping with such a shift, there is a technique for setting a read voltage, with which the reading was successful at a previous time, to a reference, changing the read voltage according to a shift read table designating the shift amount from the reference, and determining the read voltage.

The threshold voltage subjected to a read disturbance or a program disturbance is shifted from a low voltage to a high voltage. The threshold voltage subjected to data retention is shifted toward a voltage neutral point, for example, shifted from a high voltage to a low voltage.

In the technique of the comparative example, both of the shift read table for changing the read voltage from the low voltage to the high voltage and the shift read table for changing the read voltage from the high voltage to the low voltage are required in order to cope with both of the shifts of the threshold voltage from the low voltage to the high voltage and from the high voltage to the low voltage. For this reason, the data amount of the shift read table becomes large. Further, when the threshold voltage distribution is shifted by a large amount beyond the shift amount designated by the shift read table due to the shift of the threshold voltage with the lapse of time and the difference of the threshold voltage between the word lines, an appropriate read voltage cannot be determined and error recovery becomes difficult even when the read voltage is changed according to the shift read table. Furthermore, in the technique of the comparative example, the influence of the variation for each word line is not considered.

In contrast, according to this embodiment, since the voltage range used in the tracking process is changed for each word line and the elapsed time, the reference voltage for starting the tracking process can be appropriately changed according to the word line and the elapsed time.

This makes it possible to determine the read voltage and reduce the read count necessary for the tracking even when the threshold voltage is shifted with the lapse of time and the threshold voltage is different between the word lines.

According to this embodiment, it is possible to prevent deterioration of the read performance and reliability of the semiconductor memory device 1.

In this embodiment, the tracking process in the case where the data is read from the NAND-type flash memory 2 is mainly described as an example. Moreover, the read voltage may be determined by the tracking process described in this embodiment when the patrol process or the like is executed in the background.

The stress at the time of reading is different in the NAND-type flash memory 2 from that at the time of writing. For example, the value of the voltage applied to the memory cell at the time of reading differs from the value of the voltage applied to the memory cell at the time of writing. In order to make it possible to determine an appropriate read voltage even when the memory cell of the NAND-type flash memory 2 is affected by various kinds of stresses, therefore, the adjustment pattern may be determined with the lapse of time from the write reference time to the time to read in this embodiment, or the adjustment pattern may be determined with the lapse of time from the read reference time to the time to read.

Second Embodiment

Generation of the adjustment pattern data 13 according to the first embodiment will be described in this embodiment.

For example, the adjustment pattern data 13 may be either static or dynamic. More specifically, the adjustment pattern data 13 may be statically determined at the time of designing or manufacturing the NAND-type flash memory 2 or the semiconductor memory device 1, and the determined adjustment pattern data 13 may be subsequently used without any change.

On the other hand, the adjustment pattern included in the adjustment pattern data 13 may be dynamically and appropriately changed according to the use state of the NAND-type flash memory 2 or the semiconductor memory device 1.

Figure 11:
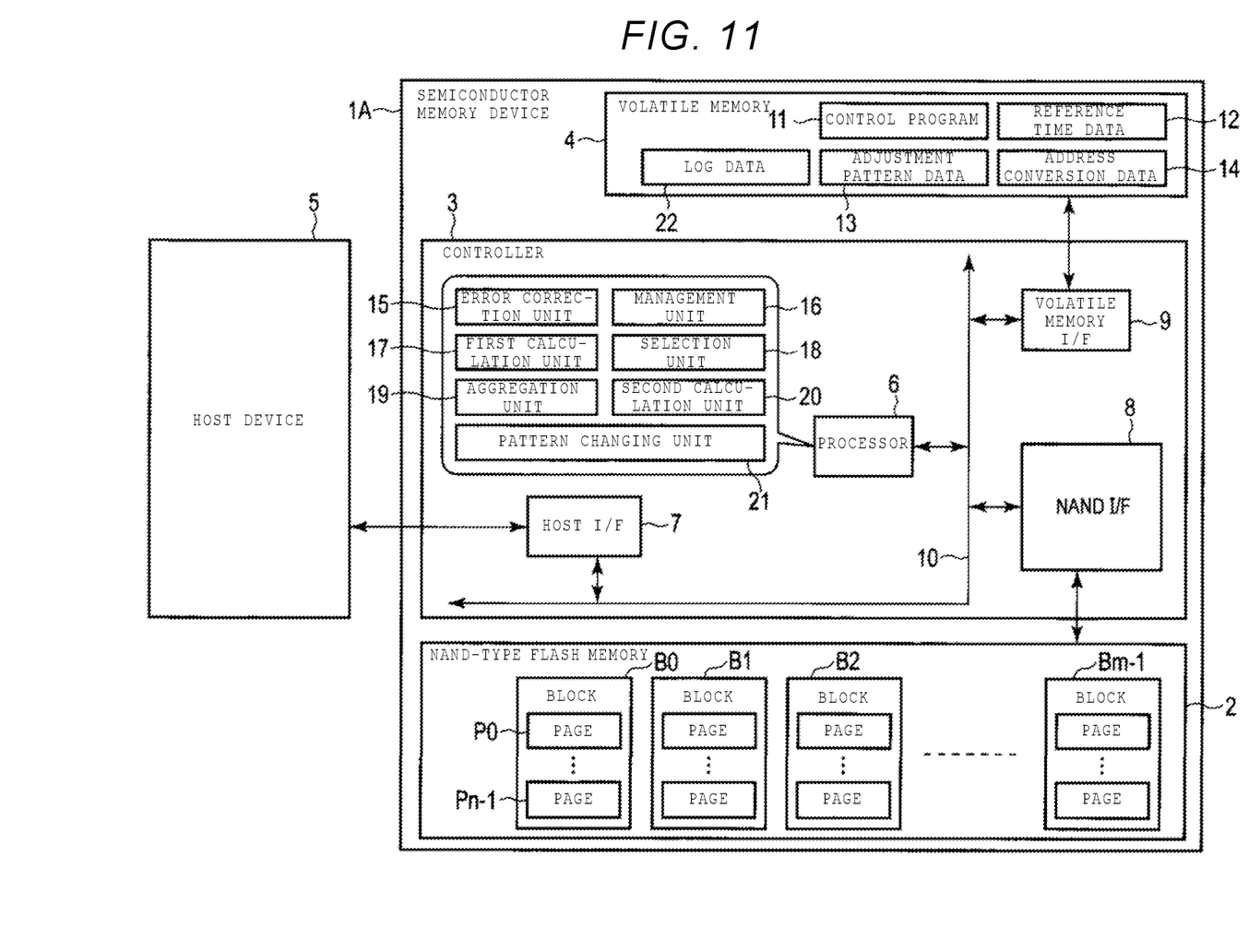
FIG. 11 is a block diagram illustrating an example of a semiconductor memory device according to a second embodiment.

FIG. 11 is a block diagram illustrating an example of a semiconductor memory device 1A according to this embodiment.

In the semiconductor memory device 1A according to this embodiment, a processor 6 further functions as a pattern changing unit 21.

The pattern changing unit 21 stores log data 22 of the semiconductor memory device 1A or the NAND-type flash memory 2 in a volatile memory 4.

The log data 22 includes, for example, values of read voltages and the number of memory cells corresponding to the read voltages, values of read voltages and the number of pages corresponding to the read voltages, or values of read voltages and the number of ECC frames corresponding to the read voltages. Here, the plurality of ECC frames are included in one page, and each of them is one unit of data in which the error correction is executed. In addition, the log data 22 may include the number of error bits per page and the number of error bits per ECC frame.

Based on the log data 22, the pattern changing unit 21 may calculate the most frequent value of the read voltage, the most frequent value of the distribution of the read voltage which minimizes the number of error bits per page or ECC frame, and a statistical value of the read voltage which maximizes the number of ECC frames at which the number of error bits per ECC frame is equal to or less than the threshold value. The pattern changing unit 21 may also determine an adjustment pattern after the change based on the calculated statistical value, and store the adjustment pattern after the change in the adjustment pattern data 13.

The process of the pattern changing unit 21 according to this embodiment may be immediately executed when the error correction on the read data fails or the number of error bits of the read data is equal to or larger than the threshold value, for example. Instead of executing immediately as described above, for example, a typical tracking process is first executed when the error correction on the read data fails or the number of error bits detected in the read data is equal to or larger than the threshold value, and when the number of error bits of the read data read from the NAND-type flash memory 2 does not decrease even if the typical tracking process is executed, the process of the pattern changing unit 21 may be executed. The process of the pattern changing unit 21 may be executed as one of the background processes executed in the semiconductor memory device 1A.

According to this embodiment described above, the tracking process according to the first embodiment can be more appropriately executed based on the use situation of the semiconductor memory device 1A or the NAND-type flash memory 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a nonvolatile memory that has a plurality of memory cells, the plurality of memory cells being connected to word lines to which a read voltage is applied at the time of reading data stored in the memory cells; and
a controller configured to determine a read voltage for a target memory cell by
selecting a tracking parameter based on a word line connected to the target memory cell and an elapsed time from a previous access to a group of memory cells including the target memory cell, and
executing a tracking process on the memory cells also connected to the word line connected to the target memory cell using the selected tracking parameter, the tracking parameter including at least one of a start read voltage used in the tracking process, a number of read voltages used in the tracking process, and a gap value between the read voltages used in the tracking process.

2. The semiconductor memory device according to claim 1, further comprising:
a table that associates the word lines to a plurality of elapsed times, and a plurality of tracking parameters, wherein
the controller selects, from the table, the tracking parameter associated with the word line connected to the target memory cell and the elapsed time.

3. The semiconductor memory device according to claim 2, further comprising:
a log that stores log data of the nonvolatile memory, wherein
the controller changes the tracking parameters stored in the table based on a statistical value that is obtained by performing statistical processing on the log data.

4. The semiconductor memory device according to claim 1, wherein
the controller calculates the tracking parameter using a formula that takes an identifier of the word line connected to the target memory cell and the elapsed time as input values.

5. The semiconductor memory device according to claim 1, further comprising:
first and second tables, each associating the word lines to a plurality of elapsed times, and a plurality of tracking parameters, wherein
the controller selects one of the first and second tables based on an access count of the group of memory cells and selects, from the selected table, the tracking parameter associated with the word line connected to the target memory cell and the elapsed time.

6. The semiconductor memory device according to claim 5, wherein the group of memory cells is a page of memory cells.

7. The semiconductor memory device according to claim 5, wherein the group of memory cells is a block of memory cells.

8. A method of determining a read voltage for a read operation to be performed on a target memory cell of a nonvolatile memory that has a plurality of memory cells including the target memory cell, the plurality of memory cells being connected to word lines, said method comprising:

maintaining first and second tables, each associating the word lines to a plurality of elapsed times, and a plurality of tracking parameters;

selecting one of first and second tables based on an access count of a group of memory cells including the target memory cell;

selecting a tracking parameter from the selected table, based on a word line connected to the target memory cell and an elapsed time from a previous access to the group of memory cells including the target memory cell; and executing a tracking process on the memory cells also connected to the word line connected to the target memory cell using the selected tracking parameter.

9. The method according to claim 8, wherein the elapsed time is selected from the table.

10. The method according to claim 9, further comprising:
maintaining a log that stores log data of the nonvolatile memory; and changing the tracking parameters stored in the table based on a statistical value that is obtained by performing statistical processing on the log data.

11. The method according to claim 8, wherein the tracking parameter includes a start read voltage used in the tracking process, a number of read voltages used in the tracking process, and a gap value between the read voltages used in the tracking process.

12. The method according to claim 8, further comprising:
calculating the tracking parameter using a formula that takes an identifier of the word line connected to the target memory cell and the elapsed time as input values.

13. The method according to claim 12, wherein the group of memory cells is a page of memory cells.

14. The method according to claim 12, wherein the group of memory cells is a block of memory cells.

15. A computing device, comprising:
a host device; and
a semiconductor memory device including a host interface configured to receive commands from the host device, a nonvolatile memory that has a plurality of memory cells, the plurality of memory cells being connected to word lines to which a read voltage is applied at the time of reading data stored in the memory cells, and a controller configured to determine a read voltage for a target memory cell by selecting a tracking parameter from a table, based on a word line connected to the target memory cell and an elapsed time from a previous access to a group of memory cells including the target memory cell, and executing a tracking process on the memory cells also connected to the word line connected to the target memory cell using the selected tracking parameter, wherein the controller is further configured to maintain a log that stores log data of the nonvolatile memory, and change one of a plurality of tracking parameters stored in the table based on a statistical value that is obtained by performing statistical processing on the log data.

16. The computing device according to claim 15, wherein the table associates the word lines to a plurality of elapsed times, and the plurality of tracking parameters.

17. The computing device according to claim 15, wherein the tracking parameter includes a start read voltage used in the tracking process, a number of other read voltages used in the tracking process, and a gap value between the read voltages used in the tracking process.

* * * * *